United States Patent [19]

Wakamori

[11] Patent Number: 5,162,822
[45] Date of Patent: Nov. 10, 1992

[54] SAW FILTER CHIP MOUNTED ON A SUBSTRATE WITH SHIELDED CONDUCTORS ON OPPOSITE SURFACES

[75] Inventor: Satoshi Wakamori, Yokohama, Japan

[73] Assignee: Hitachi, Ltd., Tokyo, Japan

[21] Appl. No.: 429,001

[22] Filed: Oct. 30, 1989

[30] Foreign Application Priority Data

Oct. 31, 1988 [JP] Japan ................................. 63-272964

[51] Int. Cl.$^5$ ..................... H03H 9/05; H03H 9/25
[52] U.S. Cl. ........................... 333/193; 310/313 R; 310/348
[58] Field of Search ................... 333/193–196, 247, 333/185; 310/313 R, 313 B, 313 C, 313 D, 348

[56] References Cited

U.S. PATENT DOCUMENTS

| | | | |
|---|---|---|---|
| 3,885,173 | 5/1975 | Lee | 310/313 B |
| 4,250,473 | 2/1981 | Gemba | 333/194 X |
| 4,423,395 | 12/1983 | Shirahama | 333/193 |
| 4,751,482 | 6/1988 | Fukuta et al. | 333/247 |
| 4,772,862 | 9/1988 | Kubo et al. | 333/185 |
| 4,845,397 | 7/1989 | Herrick et al. | 310/313 R X |

FOREIGN PATENT DOCUMENTS

| | | | |
|---|---|---|---|
| 3048817 | 9/1981 | Fed. Rep. of Germany | 333/196 |
| 2342537 | 9/1977 | France . | |
| 39613 | 4/1981 | Japan | 333/195 |
| 132807 | 10/1981 | Japan . | |
| 58907 | 9/1982 | Japan . | |
| 202114 | 12/1982 | Japan . | |
| 25524 | 6/1984 | Japan . | |
| 127813 | 7/1985 | Japan . | |
| 256217 | 12/1985 | Japan . | |
| 92014 | 5/1986 | Japan | 333/193 |
| 245709 | 11/1986 | Japan . | |
| 102410 | 5/1988 | Japan | 333/193 |
| 111713 | 5/1988 | Japan | 333/193 |

OTHER PUBLICATIONS

*Electronic Packaging Technology*, 1989, 2(vol. 5, No. 2), pp. 78–81.

Primary Examiner—Eugene R. LaRoche
Assistant Examiner—Benny Lee
Attorney, Agent, or Firm—Antonelli, Terry, Stout & Kraus

[57] ABSTRACT

A surface acoustic wave filter device having a surface acoustic wave filter chip disposed on the upper surface of a substrate, input and output conductor patterns provided on each of the upper and lower surfaces of the substrate, and grounding conductor patterns provided on each of the upper and lower surfaces of the substrate so as to surround the input and output conductor patterns on that surface in order to prevent an electromagnetic coupling between the input and output conductor patterns, whereby the out-of-band rejection of at least 40 dB is obtained in an operating band of at least 400 MHz.

29 Claims, 5 Drawing Sheets

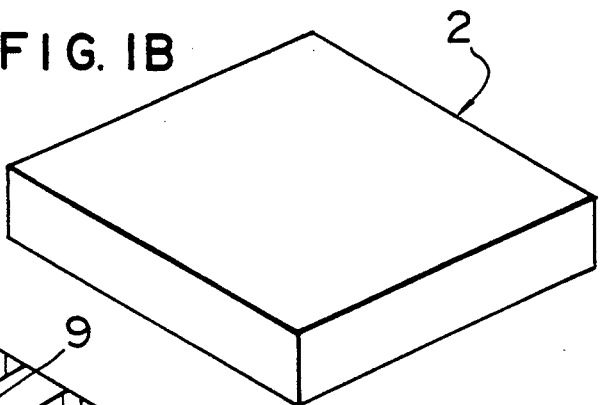
FIG. 1A  FIG. 1B
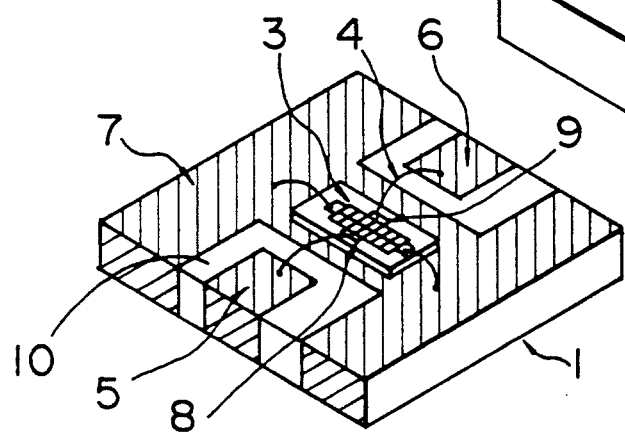
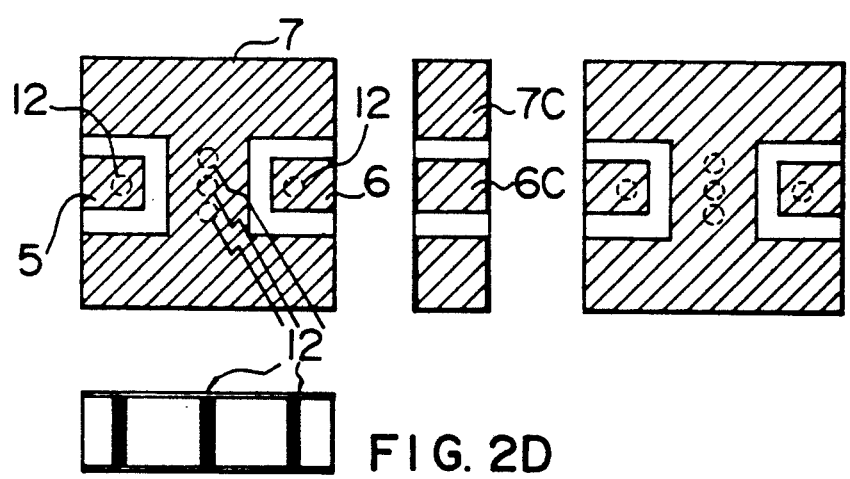
FIG. 2A  FIG. 2C  FIG. 2B
FIG. 2D F I G. 6
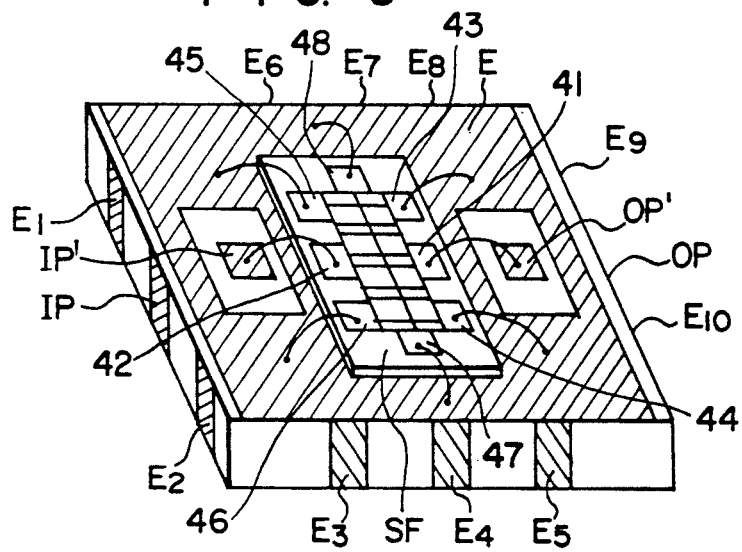
F I G. 7
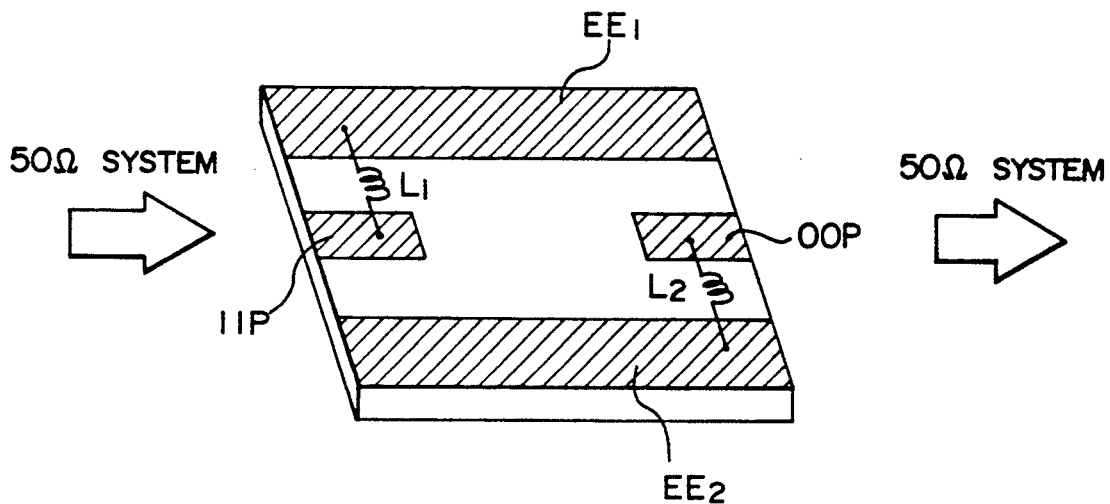

SAW FILTER CHIP MOUNTED ON A SUBSTRATE WITH SHIELDED CONDUCTORS ON OPPOSITE SURFACES

BACKGROUND OF THE INVENTION

The present invention relates to a package for SMT (Surface Mount Technology) type SAW (surface acoustic wave) filter, and more particularly to a conductor pattern structure of a substrate having a sufficient electrical isolation between input and output in a high frequency band of at least 400 MHz.

This kind of SAW filter is capable of providing a sharp cut-off characteristic for a desired pass band characteristic and has the possibility of light weight fabrication with a thin flatness form. Therefore, it can be preferably used as an IF filter for a receiver for satellite TV broadcasting or a filter for a moving body communication device such as a mobile telephone, a hand-held cellular telephone or a pager. Each of the parts of those devices has a strong demand for light weight, small thickness, short length and small size. The SAW filter is an element fabricated using a piezoelectric substrate which may include 36° rotated Y cut X propagation $LiTaO_3$ as a substrate, and some improvements thereof have been disclosed by JP-A-56-132807, JP-A-57-202114, JP-A-59-58907, etc.

The conventional package for SMT type SAW filter is provided with a plurality of patterns for terminals on an insulating substrate, as has been disclosed by JP-A-61-245709, but is not provided with a structure for preventing or blocking an electromagnetic interference between the patterns. That is, it is apparent that isolation for preventing electromagnetic interference is not a concern in this example noting that a shield for preventing electromagnetic coupling is not provided, such as between the input and output terminals. Also, a structure such as that shown in FIG. 11A is known, that is a structure in which at least one ground terminal E1 on the input side and at least one ground terminal E2 on the output side are provided in addition to a SAW filter chip SF, an input terminal IP and an output terminal OP which are provided on the upper surface (or front face) of a substrate P made of a ceramic material. However, the ground terminals E1 and E2 are not terminals for preventing an electromagnetic coupling between the input and output terminals IP and OP. Namely, the ground terminals E1 and E2 are not provided with a sufficient coupling prevention function since the input and output terminals IP and OP extend from the upper surface of the substrate P to the lower surface thereof and are disposed opposite to each other even on the lower surface of the substrate, as is best shown in FIG. 11B which shows the lower surface side (or back face) of the substrate P. Those portions of the terminals which exist on the lower surface of the substrate are only to be connected with peripheral circuits. For a low frequency band not higher than 70 MHz, there is no problem for the structure shown in FIGS. 11A and 11B. However, for a high frequency band of at least 400 MHz, a sufficient electrical isolation between input and output cannot be obtained and hence there arises a problem that the out-of-band rejection deteriorates due to electromagnetic coupling between the input and output terminals.

SUMMARY OF THE INVENTION

A primary object of the present invention is prevent an electromagnetic coupling between input and output terminals of a SAW filter device operating in a high frequency region, thereby improving a pass band characteristic of the device.

Another object of the present invention is to provide a SAW filter device having an out-of-band rejection of at least 40 dB, by providing shielding means for preventing an electromagnetic coupling between input and output terminals of an SMT type SAW filter which operates in a high frequency region of at least 400 MHz.

A further object of the present invention is to provide a SAW filter device having improved integration density of a plurality of filter characteristics in a high frequency region by providing shielding means for preventing electromagnetic couplings between input and output terminals and between terminals of each filter pattern.

A still further object of the present invention is to provide a SAW filter device the characteristic of which is improved by providing shielding means for preventing an electromagnetic coupling between the input and output terminals of an SMT type SAW filter which operates a high frequency region, and providing sealing means for sealing the chip.

According to one aspect of the present invention, a SAW filter device is provided which comprises an insulating substrate having first and second opposite surfaces, at least one SAW filter chip provided on the first surface of the substrate, first input and output conductor patterns which are provided on the first surface of the substrate and are electrically connected with the chip, second input and output conductor patterns which are provided on the second surface of the substrate and are electrically connected with the first input and output conductor patterns, respectively. This aspect of the invention further comprises shielding means comprising grounding conductor patterns grounding which are respectively provided on the first and second surfaces of the substrate between the first input and output conductor patterns and between the second input and output conductor patterns to prevent electromagnetic coupling between the input and output conductor patterns and are electrically connected with each other; and the invention also has sealing means for sealing the chip and the conductor patterns on the substrate.

According to another aspect of the present invention, the conductor pattern for grounding on each of the first and second surfaces of the substrate is disposed so as to surround the input and output conductor patterns on that surface. The grounding conductor patterns grounding on the first and second surfaces may be electrically connected with each other below the SAW filter chip via a through-hole(s) which passes through the substrate.

BRIEF DESCRIPTION OF THE DRAWINGS

FIGS. 1A and 1B show a SAW filter device according to an embodiment of the present invention and a sealing cap thereof, respectively;

FIGS. 2A, 2B, 2C and 2D are top, bottom, side and cross-sectional views, respectively, showing the layout of conductor patterns on a substrate shown in FIG. 1A;

FIG. 5 shows the conventional SAW filter device to which the measurement of the characteristic shown in FIG. 4 is related to;

FIG. 6 shows the SAW filter device according to the present invention to which the measurement of the characteristic shown in FIG. 4 is made;

FIG. 7 shows a jig used for measuring the characteristics shown in FIG. 4;

DESCRIPTION OF THE PREFERRED EMBODIMENTS

Figure 3B:
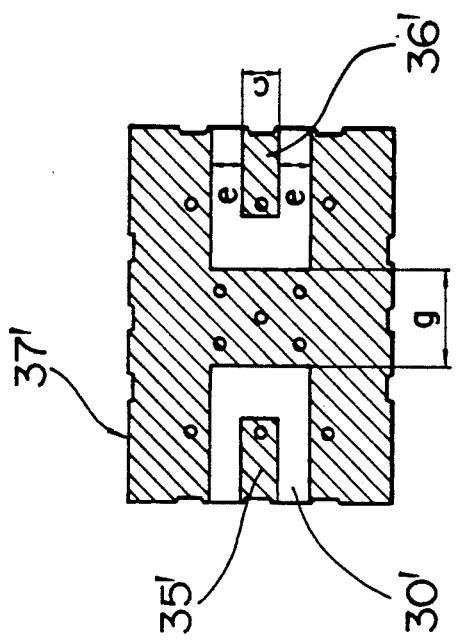
FIGS. 3A, 3B, 3C and 3D are top, bottom short and longer side surface views, respectively, showing the layout of conductor patterns in a SAW filter device according to another embodiment of the present invention.

FIGS. 1A and 1B show a SAW filter device according to an embodiment of the present invention and a sealing cap thereof, respectively. A SAW filter chip 3 is bonded by a die bonding adhesive to a substrate 1 which is made of a ceramic material and has opposite (upper and lower) main surfaces. On the substrate 1 are formed input and output conductor patterns 5 and 6 forming input and output terminals as well as a conductor pattern 7 as a grounding pattern with a layout as shown, for example, by plating Au on an Ni-plated layer. The pattern 7 is disposed so as to surround through insulating spacers 10 the patterns 5 and 6 which are provided at opposite sides of a central portion of the substrate surface. An input pad 8, an output pad 9 and ground pads on the chip 3 are electrically connected by wires 4 with the input terminal pattern 5, the output terminal pattern 6 and the grounding pattern 7 on the substrate 1, respectively. Each of the pads is made using Al evaporation. As shown in FIGS. 2A and 2B, the conductor patterns are similarly provided on both the upper and lower surfaces of the substrate 1 and the corresponding conductor patterns on the upper substrate surface and the conductor patterns on the lower surface are electrically connected with each other through extending portions thereof 6C and 7C (see FIG. 2C) which are provided on the side surface of the substrate 1. Alternatively, the corresponding conductor patterns on the upper and lower surface of the substrate 1 may be electrically connected with each other via a through-hole(s) 12 which is plated or filled with, for example, Ni. The interconnection of the grounding patterns 7 on the upper and lower surfaces of the substrate 1 by the plurality of through-holes 12 (in FIG. 2A, three through-holes) provided at the central portion of the substrate (under or in the vicinity of the chip 3) may produce an effect of preventing an electromagnetic coupling which passes through the substrate.

With the structure in which the grounding pattern 7 is disposed on each of the upper and lower surfaces of the substrate so as to surround the patterns 5 and 6, it is possible to prevent or block an electromagnetic coupling between the input and output terminal patterns. As a result, a sufficient electrical isolation between the input and output is obtained even in a high frequency band of at least than 400 MHz, thereby realizing the out-of-band rejection of at least 40 dB as well as a band characteristic having sharp cut-off responses near in-band which substantially represents the characteristic of the SAW filter chip 3. By sealing the structure of FIG. 1A by a cap 2 (see FIG. 1B) made of a non-metallic material such as resin in order to prevent external dusts and moisture, an SMT SAW filter device can be realized.

FIGS. 3A, 3B, 3C and 3D illustrate the upper surface, the lower surface, the shorter side surface and the longer side surface views, respectively, of a SAW filter device according to another embodiment of the present invention. In the figures, only the layout of conductor patterns on the upper, lower and side surfaces of a substrate and the dimensions of main parts or portions are shown and the other portions, including the SAW filter chip are omitted since they are the same as the embodiment shown in FIG. 1A.

The layout of conductor patterns in the present embodiment differs mainly from the layout of conductor patterns of FIG. 1A in that an input conductor pattern 35 (or an output conductor pattern 36) on the upper surface of a substrate (FIG. 3A) and an input conductor pattern 35' (or an output conductor pattern 36') on the lower surface of the substrate (FIG. 3B) are not connected through an extending portion on the side surface of the substrate so that each of the conductor patterns 35 and 36 on the upper surface of the substrate having a SAW filter chip provided thereon is isolated and is surrounded by an insulating spacer 30 through which a grounding conductor pattern 37 surrounds the conductor patterns 35 and 36. Like the layout shown in FIG. 2B, the input and output conductor patterns 35' and 36' (FIG. 3B) provided on the lower surface of the substrate are electrically connected with the conductor patterns 35 and 36 (FIG. 3A) on the upper surface of the substrate via through-holes 12 and an insulating spacer 30' is provided so as to surround each of the conductor patterns 35' and 36'. By thus isolating the input and output conductor patterns, it becomes possible to seal the SAW filter device by use of a metallic (or electrically conductive) cap such as cap 20 shown in FIG. 10B (FIG. 10A corresponding to a perspective view of FIGS. 3A to 3D) in conjunction with the sealing ring shown in FIGS. 3C and 3D.

Figure 3C:
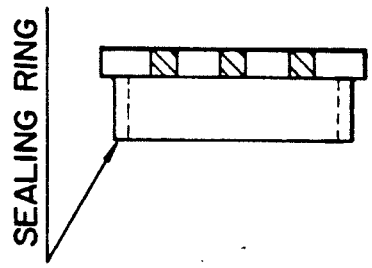
Figure 3A:
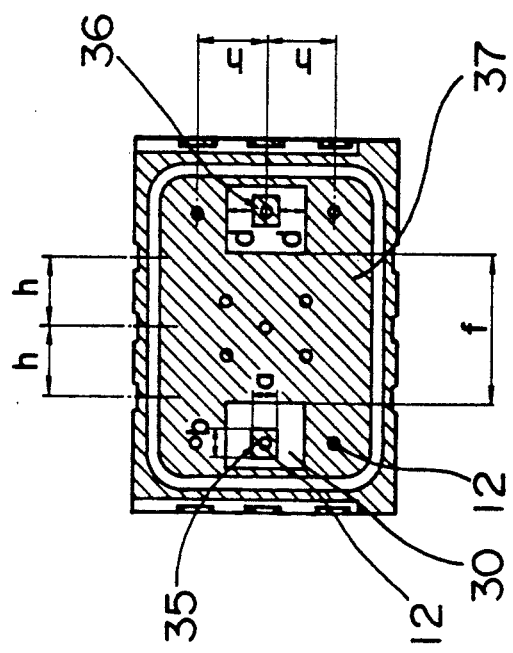
Figure 3D:
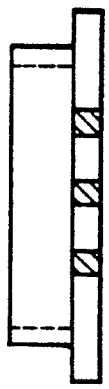

In the embodiment shown in FIGS. 3A to 3C, a ceramic substrate (Al$_2$O$_3$) of 5×7×0.5 mm is used. The conductor pattern is formed by plating Au on an Ni-plated layer so as to allow ultrasonic bonding of Al wire and to provide better soldering ability.

In FIG. 3A, the dimensions a and b are selected as 0.5 mm and 0.55 mm, respectively, taking wire bonding into consideration. The dimension c, in FIG. 3B, is selected to 0.7 mm for soldering. The dimension d in FIG. 3A, of the insulating spacer 30 between the grounding conductor pattern 37 and the conductor pattern 35 or 36 and the dimension e, in FIG. 3B of the insulating spacer 30' between the grounding conductor pattern 37' for earth and the conductor pattern 35' or 36' are important in view of electrical characteristics. In particular, the dimension e which forms a coplanar waveguide should be determined so as to provide a characteristic impedance which is matched with the impedance of the SAW filter. In the example, shown the impedance of the SAW filter is 50 Ω. Since the dielectric constant $\epsilon_r$ of the $Al_2O_3$ ceramic substrate is about 10, the impedance of the coplanar waveguide becomes 50 Ω when c/(c+2e)=0.4. Thus, e is selected to be 0.6 mm. Similarly, d is selected to be 0.5 mm. The width f of the grounding conductor pattern 37 and the width g of the grounding conductor pattern 37' are selected as 2.6 mm and 1.6 mm, respectively, so as to make them as large as possible within a range in which short-circuiting is not caused by positional deviation of wire bonding, bridging of solder, etc. The pitch h of patterns on the side surface to be soldered is selected as 1.27 mm. On each of opposite side surfaces of the substrate in a longitudinal direction thereof is provided a conductor portion which connects the grounding conductor patterns on the upper and lower surfaces of the substrate (see FIGS. 3C and 3D).

Figure 4:
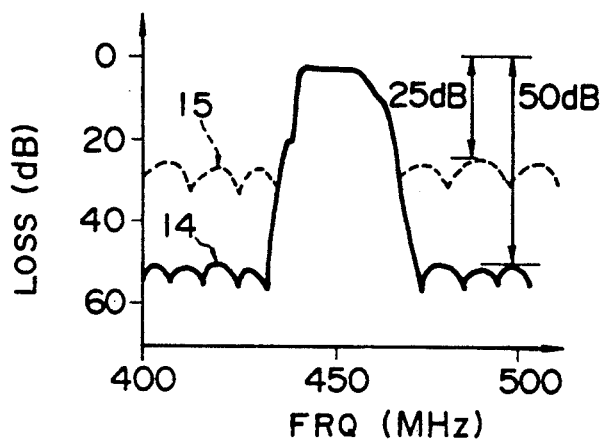
FIG. 4 is a graph comparatively showing the characteristic of a SAW filter device according to the present invention and the characteristic of a conventional SAW filter device.
Figure 5:
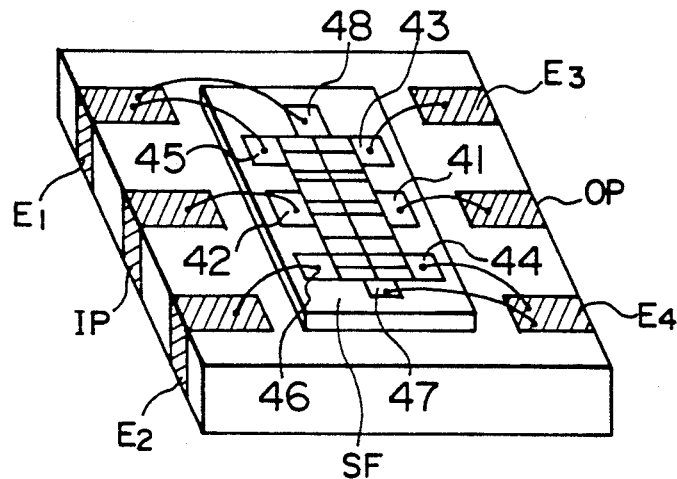

FIG. 4 comparatively shows the characteristic of a 450 MHz band SAW filter fabricated by use of the conventional SAW filter device shown in FIG. 5 using a prior art substrate and the characteristic of a 450 MHz band SAW filter fabricated by use of a SAW filter device according to the present invention shown in FIG. 6 using the substrate shown in FIGS. 3A to 3D. In FIG. 4 the ordinate indicates filter loss (in dB) and the abscissa indicates frequency (MHz). The measurement of the characteristics are made as follows A 36° rotated Y cut X propagation $LiTaO_3$ substrate which is a piezoelectric monocrystalline substrate was used to provide a 450 MHz SAW filter. Electrode or conductor patterns on the piezoelectric substrate were designed in accordance with design techniques which have been disclosed by JP-A-56-132807, JP-A-57-202114, JP-A-59-58907, etc. The chip size was 3.0×3.5 mm. As shown in FIG. 5, eight wires including two wires for input and output pads 41 and 42 and six wires for ground pads 43, 44, 45, 46, 47 and 48 are required for electrical connection with conductor patterns on the substrate. The prior art substrate was prepared with six terminals as shown in FIG. 5 and wiring was made to two input and output terminals IP and OP and four earth terminals, E1, E2, E3 and E4. In FIG. 6 showing one embodiment of the present invention, input and output pads 41, 42 are connected to IP', OP' by respective wires. Ground pads 43, 44, 45, 46, 47 and 48 are connected to grounding pattern E by six wires. As shown in FIG. 3, IP and OP are electrically connected through via-holes to IP' and OP'. The grounding pattern E is electrically connected through via-holes to earth terminals $E_1$-$E_{10}$. The substrate thus fabricated was sealed by a cap, filled with $N_2$ Gas thereby completing a SAW filter device. A jig for measurement shown in FIG. 7 was used for measurement of the electrical characteristic of the device. For the purpose of measurement, in the conventional device, connection of IP with IIP, connection of OP with OOP, connection of E1 and E3 with EE1, and connection of E2 and E4 with EE2 were made by solder. In the device according to the present invention, connection of IP with IIP, connection of OP with OOP, connection of E6, E7 and E8 with EE1, and connection of E3, E4 and E5 with EE2 were made by solder. The jig for measurement was connected with 50 Ω system coaxial cables. The electrical characteristic was measured by means of a network analyzer (8507B manufactured by HP). In FIG. 7, inductors $L_1$ and $L_2$ are matching coils for cancelling the inner capacitance of the SAW filter. As apparent from the characteristic curves shown in FIG. 4, the out-of-band rejection of the device according to the present invention (see curve 14) attains 50 dB which is larger than that of the conventional device (see curve 15) by an order of at least 20 dB.

Figure 8A:
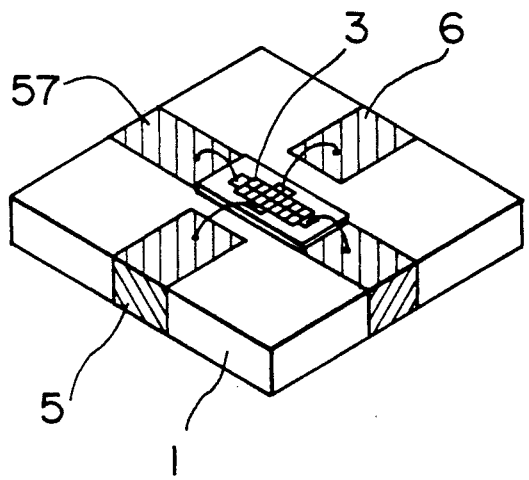
FIGS. 8A and 8B show a SAW filter device according to a further embodiment of the present invention, seen from the upper and lower surface sides of a substrate, respectively.
Figure 8B:
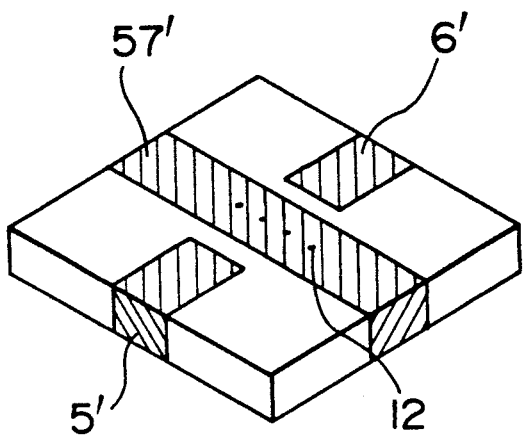

FIGS. 8A and 8B show a SAW filter device according to a further embodiment of the present invention. In the present embodiment, a stripe-shaped grounding conductor pattern 57 (or 57') is provided on each of the upper and lower surfaces of a substrate 1 between input and output conductor patterns 5 and 6 (or 5' and 6').

Figures 9A, 9B, 9C:
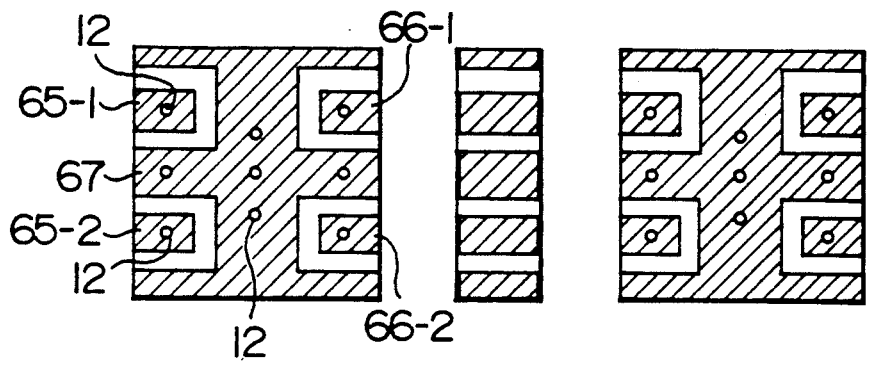
FIGS. 9A, 9B and 9C are top, bottom and side views showing the layout of conductor patterns in a SAW filter device according to a still further embodiment of the present invention.

FIGS. 9A to 9C show the layout of conductor patterns in a SAW filter device according to a still further embodiment of the present invention. In the present embodiment, two input terminal conductor patterns 65-1 and 65-2 and two output terminal conductor patterns 66-1 and 66-2 are provided, and a grounding conductor pattern 67 is interposed between the respective input and output terminal conductor patterns. The effect of the present invention can be also obtained in the present embodiment and even in the case where three or more input conductor patterns and three or more output conductor patterns are provided. Means for electrically connecting the conductor patterns on the upper and lower surfaces of a substrate shown in FIGS. 9A and 9B is not limited to a through-hole(s) 12 employed in the shown embodiment.

According to the present invention, it becomes possible to mount within one package a SAW filter chip having a plurality of filter characteristics.

Figures 10A, 10B:
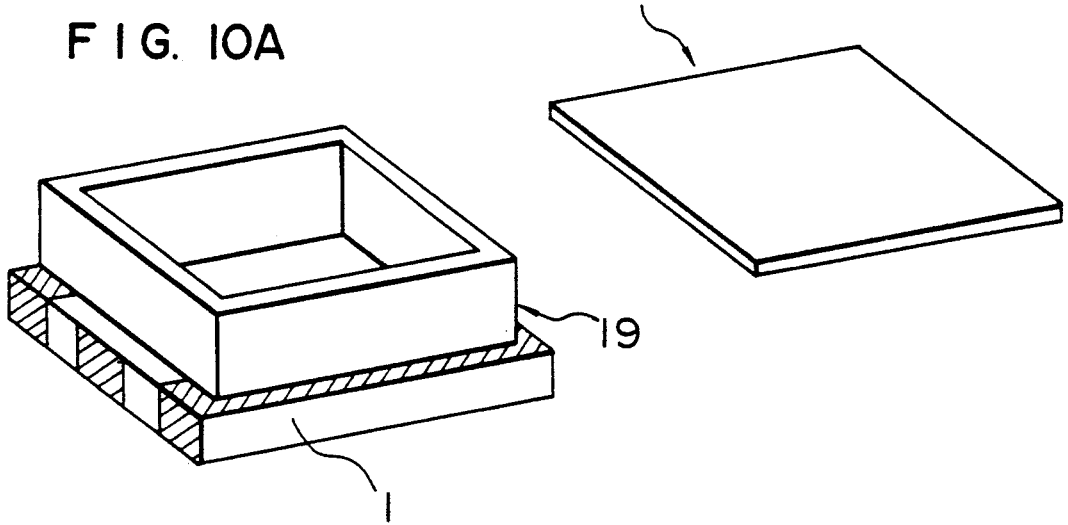
FIGS. 10A and 10B show a SAW filter device according to an even still further embodiment of the present invention.
Figure 11A:
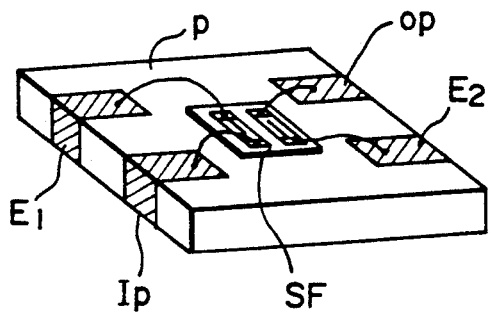
FIGS. 11A and 11B show an example of the conventional SAW filter device.
Figure 11B:
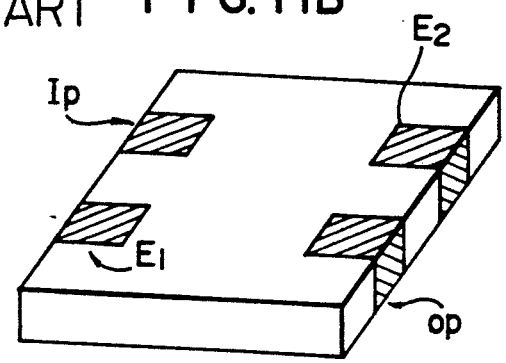

FIGS. 10A and 10B show a SAW filter device according to an even still further embodiment of the present invention. The present embodiment has a structure in which a sealing ring 19 is secured to a substrate 1 through silver-alloy brazing like FIGS. 3A to 3C and a metallic plate 20 is welded to the sealing ring 19, for example, through seam welding. With such a structure, it is possible to realize a hermetically sealed package which is highly protected from dusts and moisture (for example, satisfying the military standard of the order of $1\times10^{-8}$ atm cc/sec He) and to obtain an effect of shielding external electromagnetic waves.

As has been mentioned above according to the present invention, since a sufficient electrical isolation between input and output can be obtained, SMT type SAW filter device can be realized which has the out-of-band rejection of at least 40 dB even for a high frequency band of at least 400 MHz.

I claim:
1. A surface acoustic wave filter device comprising:
an insulating substrate having first and second opposite surfaces;
at least one surface acoustic wave filter chip provided on said first surface of said substrate, wherein said chip has a plurality of grounding pads grounded at a same grounding potential;
first input and output conductor patterns which are provided on said first surface of said substrate and, via first conductive means, being electrically connected with said chip;
second input and output conductor patterns which are provided on said second surface of said substrate and, via second conductive means, being electrically connected with said first input and output conductor patterns, respectively;

shielding means including grounding conductor patterns, which are respectively provided on said first and second surfaces of said substrate, having portions extending between said first input and output conductor patterns and between said second input and output conductor patterns, respectively, and which are disposed so that the input and output conductor patterns provided on the first and the second surface of said substrate are each surrounded by a respective one of said grounding conductor patterns, provided on said first surface and second surface, to prevent electromagnetic coupling between the input and output conductor patterns, wherein said grounding conductor patterns on said first and second surfaces are electrically connected with each other via third conductive means, and wherein said plurality of grounding pads of said chip are electrically connected to the grounding conductor pattern on said first surface of said substrate; and sealing means for sealing said chip and the conductor patterns on said substrate.

2. A surface acoustic wave filter device according to claim 1, wherein said third conductive means passes through said substrate for electrically connecting said grounding conductor patterns provided on said first and second surfaces of said substrate.

3. A surface acoustic wave filter device according to claim 2, wherein said second conductive means includes first means, passing through said substrate, for electrically connecting said first and second input conductor patterns provided on said first and second surfaces, respectively, of said substrate and further includes second means, passing through said substrate, for electrically connecting said first and second output conductor patterns provided on said first and second surfaces, respectively, of said substrate.

4. A surface acoustic wave filter device according to claim 1, wherein an insulating spacer is provided on said first surface of said substrate around each of said first input and output conductor patterns to isolate said first input and output conductor patterns, respectively, from the grounding conductor pattern provided on said first surface.

5. A surface acoustic wave filter device according to claim 1, wherein said grounding conductor patterns are provided in a stripe-shaped form extending between said first input and output conductor patterns, on said first surface, and between said second input and output conductor patterns, on said second surface of said substrate, and wherein said third conductive means is effected by further extending, as part of the stripe-shaped form, said grounding conductor patterns around opposing end side surfaces of said substrate.

6. A surface acoustic wave filter device according to claim 1, wherein said grounding conductor patterns are provided in a stripe-shaped form extending between said first input and output conductor patterns, on said first surface, and between said second input and output conductor patterns, on said second surface of said substrate, and further extending around opposing end side surfaces of said substrate as part of the stripe-shaped form.

7. A surface acoustic wave filter device according to claim 1, wherein said sealing means includes a cap which is made of resin and bonded to said substrate.

8. A surface acoustic wave filter device according to claim 1, wherein said sealing means includes a cap member which is made of a metallic material and secured to the conductor patterns on said substrate.

9. A surface acoustic wave filter device according to claim 8, wherein the cap of said device results in a hermetic seal satisfying the standard on the order of $1 \times 10^{-8}$ atm cc/sec He.

10. A surface acoustic wave filter device according to claim 1, wherein the device has an out-of-band rejection of at least 50 dB when operating at a high frequency region of at least 400 MHz.

11. An SMT type surface acoustic wave device comprising a surface acoustic wave filter chip including a piezoelectric substrate and having electrode patterns disposed thereon; an insulating substrate secured to said chip by a die bonding adhesive and having upper and lower surface thereof on which conductor patterns, electrically connected to said chip by wire bonding provided on the upper surface of said insulating substrate, are disposed; and a cap for hermetically sealing the device, wherein said conductor patterns on each of said upper and lower surfaces of said insulating substrate include at least one input pattern, at least one output pattern and a grounding pattern, the grounding pattern is disposed between the input pattern and the output pattern so as to surround the input and output patterns, and each of the input, output and grounding patterns on the upper surface of said insulating substrate are electrically connected to the input, output and grounding patterns on the lower surface of said substrate, respectively.

12. An SMT type surface acoustic wave device according to claim 11, wherein said at least one input pattern and at least one output pattern includes a plurality of said input patterns and a plurality of said output patterns, respectively, disposed on each of said upper and lower surfaces of said substrate and respective ones of the input pattern and output patterns on said upper surface are electrically connected with corresponding ones of the input patterns and output patterns on said lower surface of said substrate, respectively, via conductive means.

13. A surface acoustic wave filter device comprising:

an insulating rectangular-shaped substrate having first and second opposite surfaces that are continuous between respective pairs of opposing end sides;

at least one surface acoustic wave filter chip provided on said first surface of said substrate, said surface acoustic wave chip having a plurality of grounding pads grounded at a same grounding potential;

first input and output conductor patterns, provided on said first surface of said substrate, being respectively electrically coupled with said chip;

second input and output conductor patterns, provided on said second surface of said substrate, being respectively electrically coupled with said first input and output conductor patterns;

shielding means including grounding conductor patterns, which are respectively provided on said first and second surfaces of said substrate, having portions extending between said first input and output conductor patterns and between said second input and output conductor patterns, respectively, and which are disposed so that the input and output conductor patterns provided on the first and second surfaces of said substrate are each surrounded by a respective one of said grounding conductor patterns, provided on said first surface and said second surface, thereby preventing electromagnetic coupling between the input and output conductor patterns, wherein said grounding conductor patterns are electrically coupled with each other, and wherein said plurality of grounding pads of said chip are electrically connected to the grounding conductor pattern on said first surface of said substrate; and sealing means for sealing said chip and the conductor patterns on said substrate.

14. A surface acoustic wave filter device according to claim 13, further including conductive through-holes disposed through said substrate for electrically connecting said grounding conductor patterns which are provided on said first and second surfaces of said substrate.

15. A surface acoustic wave filter device according to claim 14, wherein first means, passing through said substrate, is provided for electrically connecting said first and second input conductor patterns provided on said first and second surfaces, respectively, of said substrate and second means, passing through said substrate, is provided for electrically connecting said first and second output conductor patterns provided on said first and second surfaces, respectively, of said substrate.

16. A surface acoustic wave filter device according to claim 13, wherein a respective insulating spacer is provided on said first surface of said substrate around each of said first input and output conductor patterns to respectively isolate each one thereof from the grounding conductor pattern provided on said first surface.

17. A surface acoustic wave filter device according to claim 13, wherein said sealing means includes a cap which is made of resin and bonded to said substrate.

18. A surface acoustic wave filter device according to claim 13, wherein said sealing means includes a cap member which is made of a metallic material and secured to the conductor patterns on said substrate.

19. A surface acoustic wave filter device comprising:
an insulating rectangular-shaped substrate having first and second opposite surfaces that are continuous between respective pairs of opposing end sides;
at least one surface acoustic wave filter chip provided on said first surface of said substrate;
first input an output conductor patterns, provided on said first surface of said substrate, being respectively electrically coupled with said chip;
second input and output conductor patterns, provided on said second surface of said substrate, being respectively electrically coupled with said first input and output conductor patterns;
shielding means including grounding conductor patterns which are respectively provided on said first and second surfaces of said substrate so as to surround each of the input and output conductor patterns to prevent electromagnetic coupling between the input and output conductor patterns, wherein said grounding conductor patterns are electrically coupled with each other, and wherein the grounding conductor pattern on said first surface of said substrate is electrically coupled to provide a ground potential to said chip; and
sealing means for sealing said chip and the conductor patterns on said substrate.

20. A surface acoustic wave filter device according to claim 19, wherein each one of said at least one surface acoustic wave filter chip has an input pad, output pad and a plurality of grounding pads, said input pad and output pad are electrically connected via said first means with said input and output conductor patterns, respectively, said grounding pads are electrically connected through lead conductors with respective portions of said grounding conductor on the first surface of said substrate so that said grounding pads are set at an equal ground potential, thereby preventing possible degradation in out-of-band rejection characteristic of said filter device.

21. An SMT type surface acoustic wave device comprising a surface acoustic wave filter chip including a piezoelectric substrate and having electrode patterns disposed thereon; an insulating substrate secured to said chip by a die bonding adhesive and having upper and lower surfaces thereof on which conductor patterns, electrically connected to said chip by wire bonding provided on the upper surface of said insulating substrate, are disposed; and a cap for hermetically sealing an internal space in which said chip and said conductor patterns on said insulation substrate are included, wherein the conductor patterns on each of said upper and lower surface of said insulating substrate include at least one input pattern, at least one output pattern and a grounding pattern, wherein on each of said upper and lower surfaces of said insulating substrate the grounding pattern has a portion extending between the input pattern and the output pattern so as to surround the input and output patterns, and each of the input patterns, the output patterns and the grounding patterns on said upper and lower surfaces of said insulating substrate are respectively electrically connected with each other, wherein the device has an out-of-band rejection of at least 50 dB when operating at a high frequency region of at least 400 MHz, and wherein the cap of said device results in a hermetic seal satisfying the standard on the order of $1 \times 10^{-8}$ atm cc/sec He.

22. An SMT type surface acoustic wave device according to claim 21, wherein said at least one input pattern and at least one output pattern includes a plurality of said input patterns and a plurality of said output patterns, respectively, disposed on each of said upper and lower surface of said insulating substrate and respective ones of the input patterns and output patterns on said upper surface are electrically connected with corresponding ones of the input patterns and output patterns on said lower surface of said substrate, respectively, via conductive means.

23. A surface acoustic wave filter device comprising:
an insulating substrate having first and second opposite surfaces;
at least one surface acoustic wave filter chip provided on said first surface of said substrate;
first input and output conductor patterns which are provided on said first surface of said substrate and, via first conductive means, being electrically connected with said chip;
second input and output conductor patterns which are provided on said second surface of said substrate and, via second conductive means, being electrically connected with said first input and output conductor patterns, respectively;
shielding means including grounding conductor patterns which are respectively provided on said first and second surfaces of said substrate, wherein said grounding conductor patterns are disposed so that input and output conductor patterns provided on the first and second surfaces of said substrate are each surrounded by a grounding conductor pattern provided on said first surface and second surface, respectively, to prevent electromagnetic coupling between the input and output conductor patterns, wherein said grounding conductor patterns on said first and second surfaces, are electrically connected with each other, and wherein the grounding conductor pattern on said first surface of said substrate is electrically coupled to provide a ground potential to said chip; and sealing means for sealing said chip and the conductor patterns on said substrate.

24. A surface acoustic wave filter device according to claim 23, wherein each one of said at least one surface acoustic wave filter chip has an input pad, output pad and a plurality of grounding pads, said input pad and output pad are electrically connected via said first means with said input and output conductor patterns, respectively, said grounding pads are electrically connected through lead conductors with respective portions of said grounding conductor on the first surface of said substrate so that said grounding pads are set at an equal ground potential, thereby preventing possible degradation in out-of-band rejection characteristic of said filter device.

25. A surface acoustic wave filter device with improved filtering capability, comprising:

an insulating substrate having first and second main opposite surfaces;

at least one surface acoustic wave filter chip provided on the first surface of said insulating substrate and having an input pad, output pad and a plurality of grounding pads provided on said first surface;

first input and output conductor patterns which are provided on said first surface of said substrate, spaced-apart from said chip, and which are electrically connected with said input and output pads of said chip respectively via first conductive means disposed so as to extend over spacings between said chip and said first input and output pads, respectively;

second input and output conductor patterns which are provided on the second surface of said substrate for connection with circuits external of said chip and which are electrically connected with said first input and output conductor patterns, respectively, via second conductive means; and shielding means including first and second grounding conductor patterns which are respectively provided on said first and second surfaces of said substrate, said first grounding conductor pattern being disposed to surround each of said at least one surface acoustic wave filter chip and said first input and output conductor patterns, said second grounding conductor pattern being disposed to surround each of said second input and output conductor patterns, and said first and second grounding conductors being electrically connected with each other via third conductive means, thereby preventing electromagnetic couplings between said input and output conductor patterns on said first and second surfaces, respectively, wherein said first conductive means further includes means for respectively electrically connecting each one of said plurality of grounding pads of said chip with a respective portion of said first grounding conductor pattern on said first surface of said substrate to set all of said plurality of grounding pads at an equal ground potential, thereby preventing degradation in out-of-band rejection characteristic of said filter device.

26. A surface acoustic wave filter device according to claim 25, further including fourth conductive means comprising additional conductor patterns extending on peripheral side surfaces between said main opposite surfaces of said substrate thereby electrically connecting respective side portions of said first and second grounding conductor patterns.

27. A surface acoustic wave filter device according to claim 25, further including fourth conductive means for electrically connecting said first and second grounding patterns through via-holes passing selected portions of said substrate.

28. A surface acoustic wave filter device according to claim 25, wherein said means for electrically connecting said plurality of grounding pads to said first grounding conductor pattern comprises individual lead conductors extending above part of said first grounding conductor pattern to electrically connect selected portions of said first grounding conductor pattern with the respective grounding pads of said chip.

29. A surface acoustic wave filter device according to claim 25, wherein said first and second grounding conductor patterns are provided substantially in their entirety, except peripheral spaces of said first input an output conductor patterns, on said first main surface of said substrate.

* * * * *